(12) United States Patent
Wu et al.

(10) Patent No.: US 12,181,508 B2
(45) Date of Patent: Dec. 31, 2024

(54) METHOD AND APPARATUS CONFIGURING CONDUCTIVE PLANE

(71) Applicant: Wei Wu, Wenzhou (CN)

(72) Inventors: Wei Wu, Wenzhou (CN); Yuejia Wu, Wenzhou (CN)

(*) Notice: Subject to any disclaimer, the term of this patent is extended or adjusted under 35 U.S.C. 154(b) by 214 days.

(21) Appl. No.: 17/773,590

(22) PCT Filed: Nov. 13, 2020

(86) PCT No.: PCT/CN2020/128548
§ 371 (c)(1),
(2) Date: Apr. 29, 2022

(87) PCT Pub. No.: WO2021/098591
PCT Pub. Date: May 27, 2021

(65) Prior Publication Data
US 2022/0413030 A1    Dec. 29, 2022

(30) Foreign Application Priority Data
Nov. 23, 2019 (CN) .......................... 201911160853.0

(51) Int. Cl.
*G01R 31/00* (2006.01)
(52) U.S. Cl.
CPC ................. *G01R 31/001* (2013.01)
(58) Field of Classification Search
CPC ............... G01R 31/001; G01R 31/002; G01R 31/2886; G01R 31/2889; G01R 31/28;
(Continued)

(56) References Cited

U.S. PATENT DOCUMENTS 5,347,867 A * 9/1994 Pangerl ................. G01P 15/125
73/514.32
5,585,808 A * 12/1996 Wysome .............. G01R 31/001
343/703
(Continued)

FOREIGN PATENT DOCUMENTS

| CN | 1760683 A | 4/2006 |
| CN | 101820303 | * 9/2010 |
| CN | 109828162 | * 5/2019 |

OTHER PUBLICATIONS

Name of the author: Zhu Bangtian title of the article: Electronic Circuit Utility Anti-Interference Technology title of item: Book; date: Oct. 31, 1994; pp. 398-399 ; Publisher: People's Post and Telecommunications Publishing House, China.
(Continued)

*Primary Examiner* — Thang X Le

(57) ABSTRACT

A method and apparatus for configuring a conductive plane for electromagnetic compatibility test of equipment or device. A positioning object is fixed above the plane of a conductive plane, the positioning object contacts an equipment under test (EUT), and the distance from the EUT to the conductive plane is equal to the distance from the positioning object to the conductive plane plus the thickness of the positioning object, thereby avoiding an error in measurement caused by a change in the distance from the conductive plane to the EUT during each test. In addition, the device is portable, and the conductive plane does not need to be grounded, and may be applied to a production site or field in which no grounding is available.

8 Claims, 6 Drawing Sheets

1. Conductive plane
2. Positioning object
3. Object with measurable thickness

(58) Field of Classification Search
CPC ... G01R 1/04; G01R 1/06; G01R 1/18; G01R 1/07342; G01R 1/06711; G01R 1/06772; G01R 29/0814; G01R 29/0821; G01R 29/0871; G01R 29/26; G01R 29/10; G01R 29/08
See application file for complete search history.

(56) References Cited

U.S. PATENT DOCUMENTS

| | | | |
|---|---|---|---|
| 7,106,050 B1 * | 9/2006 | Scranton | G01R 1/18 |
| | | | 361/818 |
| 2011/0306252 A1 * | 12/2011 | Chen | H01R 43/16 |
| | | | 439/834 |
| 2013/0251162 A1 * | 9/2013 | He | H04R 29/001 |
| | | | 381/58 |
| 2019/0221938 A1 * | 7/2019 | Kuroiwa | H01Q 9/27 |

OTHER PUBLICATIONS

Name of the author: Zhang Yiqi title of the article: electronic design reliability engineering title of item: Book; date: Sep. 30, 2014; pp. 486,490 ; Publisher: Xi'an University of Electronic Science and Technology Press, China.

* cited by examiner

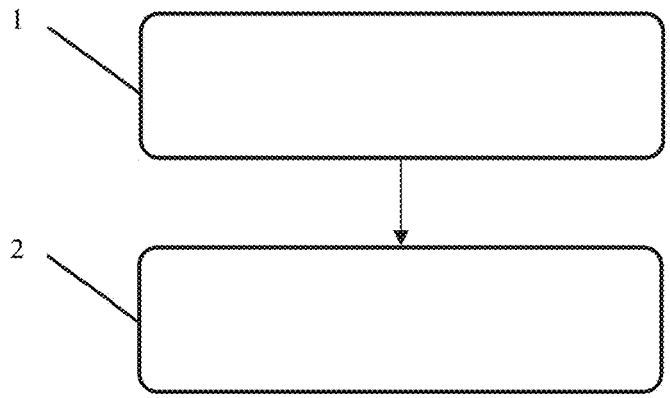

1. A positioning object is fixed above or below the plane of a conductive plane, and the shape and size of the conductive plane and the positioning object are not limited.
2. Positioning object contacting the object under test, the vertical distance from the contact point to the conductive plane is equal to the distance from the positioning object to the conductive plane on the vertical line plus the thickness of the positioning object.

FIG. 1

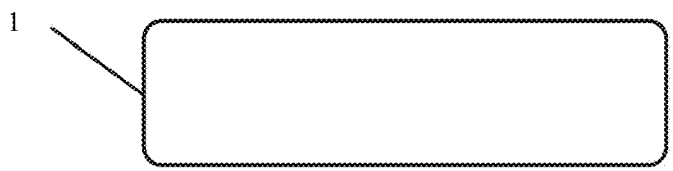

1. Set the conductive plane to face the object under test, the conductive plane is not grounded, but connected to the protective earthing wire of the AC power supply.

FIG. 2

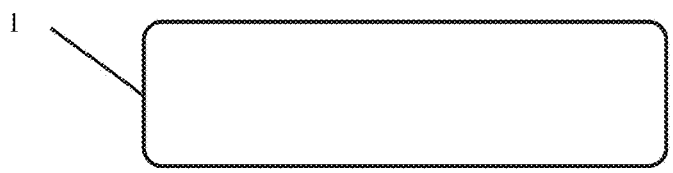

1. Set the conductive plane to face the object under test, the conductive plane is not grounded, nor connected to the protective earthing wire.

FIG. 3

1. Conductive plane
2. Positioning object

1. Conductive plane
2. Positioning object
3. Object with measurable thickness

1. Conductive plane
2. Positioning object 1. 2X2m metal plate
2. PE wire connection point
3. EUT
4. Artificial power network
5. Measurement receiver
6. Output power of artificial power network
7. PE wire
8. Coaxial cable
9. Input power of artificial power network

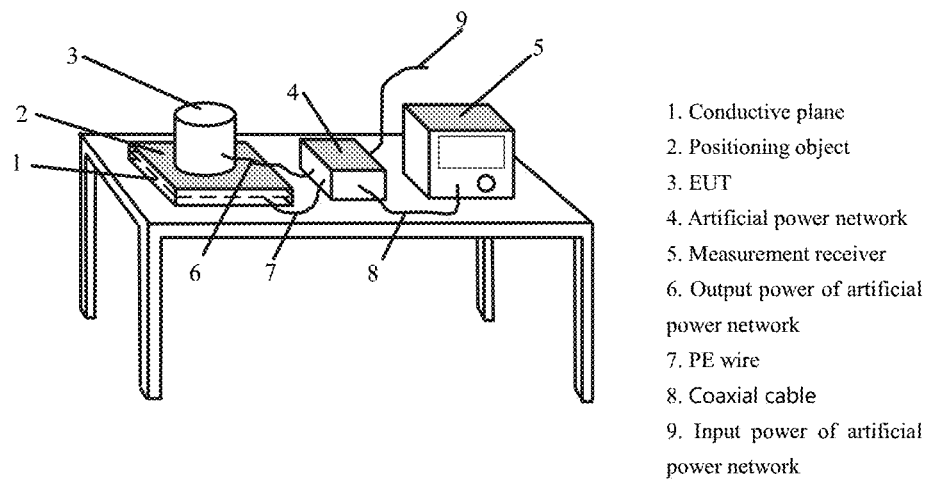

1. Conductive plane
2. Positioning object
3. EUT
4. Artificial power network
5. Measurement receiver
6. Output power of artificial power network
7. PE wire
8. Coaxial cable
9. Input power of artificial power network

FIG.8

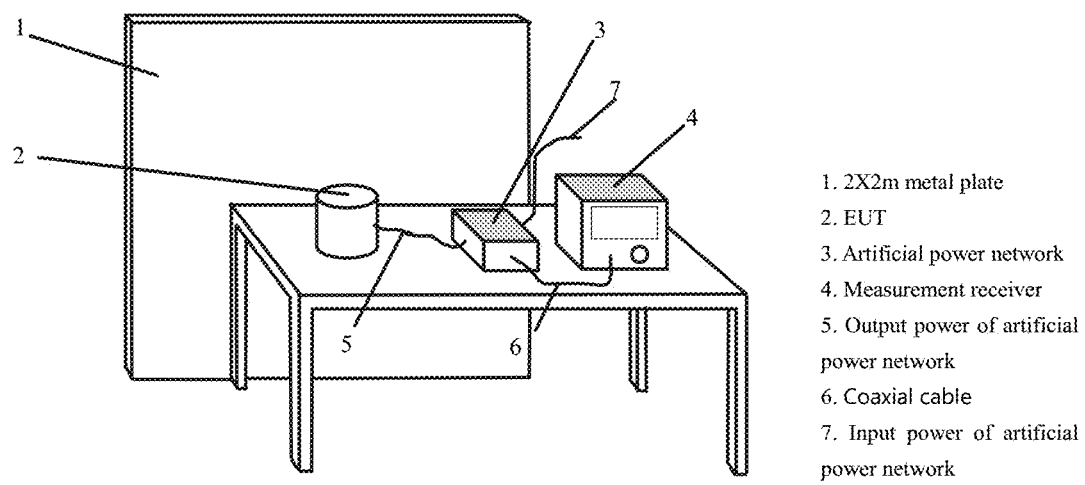

1. 2X2m metal plate
2. EUT
3. Artificial power network
4. Measurement receiver
5. Output power of artificial power network
6. Coaxial cable
7. Input power of artificial power network

FIG.9

1. Conductive plane
2. Positioning object
3. EUT
4. Artificial power network
5. Measurement receiver
6. Output power of artificial power network
7. Coaxial cable
8. Input power of artificial power network 1. Conductive plane
2. Positioning object
3. Power filter 1. Conductive plane
2. Positioning object
3. Artificial power network

METHOD AND APPARATUS CONFIGURING CONDUCTIVE PLANE

The present application is based on, and claims priority from, Chinese application number 201911209215.3, filed on Nov. 23, 2019, the disclosure of which is hereby incorporated by reference herein in its entirety.

TECHNICAL FIELD

The invention relates to a method and device for setting a conductive plane, in particular to a method and device for setting a conductive plane for measuring electromagnetic interference (hereinafter referred to as EMI) of equipment or devices.

BACKGROUND TECHNIQUE

Existing EMI measurement technology of equipment or devices requires that a grounded conductive plane be set near the equipment or device under test (hereinafter referred to as EUT) in order to provide an interference current channel for the EUT. Since the conductive plane and the EUT form a capacitor connected in series in the interference current channel, the change in the distance between the conductive plane and the EUT will result in a change in capacitance, which will result in a change in the interference current between the EUT and the conductive plane. In order to obtain the same results for repeated tests of the EUT, it must be ensured that the distance is kept unchanged for each measurement. In addition, the existing EMI measurement technology of equipment or devices requires that the conductive plane must be well grounded, and in the site where the equipment or devices were manufactured or applied, usually a good grounding environment is not always available, making it difficult to measure EMI of equipment or devices on site.

TECHNICAL PROBLEM

Several methods and devices for setting conductive planes for EMI measurement of equipment or devices are proposed.

TECHNICAL SOLUTIONS

Propose the following technical solutions.

A method for positioning a conductive plane, wherein it comprises: fixing a positioning object above or below a plane of a conductive plane, the shape and size of the conductive plane and the positioning object are not limited; contacting the EUT with the positioning object on the side opposite to the side facing the conductive plane, such that the length of a vertical line perpendicular to the conductive plane from the point of contact to the conductive plane is equal to the distance from the side of the positioning object on that vertical line facing the conductive plane to the conductive plane plus the thickness of the positioning object on the vertical line.

The positioning method, wherein contacting the EUT with the positioning object on the side opposite to the side facing the conductive plane, includes contacting the EUT from different directions.

The positioning method, wherein contacting the EUT with the positioning object on the side opposite to the side facing the conductive plane, includes indirectly contacting the EUT through an object with a measurable thickness, so that the distance between the conductive plane and the EUT is equal to the distance from the side of the positioning object facing the conductive plane to the conductive plane plus the thickness of the positioning object and plus the thickness of the object with a measurable thickness. In other words, the length of the vertical line perpendicular to the conductive plane from the contact point to the conductive plane is equal to the distance from the side of the positioning object on the vertical line facing the conductive plane to the conductive plane plus the thickness of the positioning object on the vertical line and plus the thickness of the object on which the thickness can be measured.

The positioning method, wherein the distance from the conductive plane to the EUT, when contacting the EUT with the positioning object on the side opposite to the side facing the conductive plane, is changed by changing the distance from the side of the positioning object facing the conductive plane to the conductive plane on the vertical line, or by changing the thickness of the positioning object.

The positioning method, wherein said fixing a positioning object above or below a plane of a conductive plane includes integrating the conductive plane and the positioning object into a whole.

A method for setting a conductive plane, wherein the conductive plane is set to face the EUT, the conductive plane is not grounded, and the conductive plane is connected to a Protective Earthing (hereinafter referred to as PE) wire of an AC power source.

A method for setting a conductive plane, wherein the conductive plane is set to face the EUT, the conductive plane is not grounded, nor is it connected to the PE.

A conductive plane device, wherein it comprises: a conductive plane and a positioning object are fixed by the device, the positioning object is located above or below the plane of the conductive plane, and the shape and size of the conductive plane and the positioning object are not limited; the device presets the distance from the conductive plane to the positioning object perpendicular to the conductive plane, such that when the positioning object contacts the EUT on the side opposite to the side facing the conductive plane, the length of the vertical line perpendicular to the conductive plane from the contact point to the conductive plane is equal to the distance from the side of the positioning object facing the conductive plane on the vertical line to the conductive plane plus the thickness of the positioning object on the vertical line.

The conductive plane device, wherein the conductive plane does not depend on grounding and PE connection.

The conductive plane device, wherein the conductive plane is not grounded, and the conductive plane is connected to the PE wire.

The conductive plane device, wherein the conductive plane is neither grounded nor connected to the PE wire.

The conductive plane device, wherein the positioning object contacts the EUT on the side opposite to the side facing the conductive plane, including contacting the EUT from different directions.

The conductive plane device, wherein the distance between the positioning object and the conductive plane of the device is adjustable.

The conductive plane device, wherein the device is integrated with other instruments or devices to form an instrument or device with a conductive plane.

BENEFICIAL EFFECT

The beneficial effects of the method and device disclosed in this application are as follows: 1. By presetting the distance between the conductive plane and the positioning object, positioning of the conductive plane relative to the EUT can be conveniently completed by contacting the positioning object with the EUT, avoiding measurement error caused by the change of the distance between the conductive plane and the EUT which may happen each time performing a new measurement.

2. The shape and size of the conductive plane and the positioning object are not required, so that the conductive plane and the positioning object can be made in a shape and size suitable for carrying, or the conductive plane and the positioning object can be embedded in other testing instruments or devices, which is convenient for interference test of the equipment or device at various production sites or in the field.

3. The conductive plane is not grounded, which eliminates the requirement for grounding of the test environment, making it possible to test the EMI of the equipment or device under test at the production or application site.

4. The conductive plane does not depend on grounding or PE wire. There is no need to be grounded or connected to a PE wire, making it possible to test the EMI performance of the equipment or device under test in a field environment.

5. It can be integrated with other EMI testing instruments or components, reducing the overall volume of the EMI testing system or reducing the overall cost, making it more portable and convenient to use.

DESCRIPTION OF THE DRAWINGS

FIGS. 1-3 are flowcharts of the methods disclosed in this application; FIGS. 4-13 are schematic diagrams describing specific embodiments 1-8 of one or more implementation methods or devices, respectively.

THE BEST MODE OF THE PRESENT INVENTION

The application will be further described in detail below with reference to the drawings and embodiments.

FIG. 1 is a flowchart of a conductive plane positioning method disclosed in this application. The specific implementation of the conductive plane positioning method disclosed in this application comprises: fixing a positioning object above or below a plane of a conductive plane, the shape and size of the conductive plane and the positioning object are not required; contacting the EUT with the positioning object on the side opposite to the side facing the conductive plane, such that the length of a vertical line perpendicular to the conductive plane from the point of contact to the conductive plane is equal to the distance from the side of the positioning object on that vertical line facing the conductive plane to the conductive plane plus the thickness of the positioning object on the vertical line. This completes the positioning of the conductive plane relative to the EUT.

FIG. 2 is a method for setting a conductive plane disclosed in this application, wherein the conductive plane is set to face the EUT, the conductive plane is not grounded, and the conductive plane is connected to the PE wire.

Many manufacturers of products or equipment often do not have a good grounding environment that meets the requirements of electromagnetic compatibility testing standards. The method shown in FIG. 2 uses the protective earthing wire of the company's existing power supply network to replace the grounding wire to connect the conductive plane, which can conduct EMI testing and get the same test result as connecting the ground wire.

FIG. 3 is another method for setting a conductive plane disclosed in this application, wherein the conductive plane is set to face the EUT, and the conductive plane is neither grounded nor connected to the PE wire.

In some environments where there is neither a ground wire nor a PE wire, such as a field environment, the method shown in FIG. 3 can perform EMI testing and obtain an interference spectrum similar to the test under grounding conditions.

Figure 7:
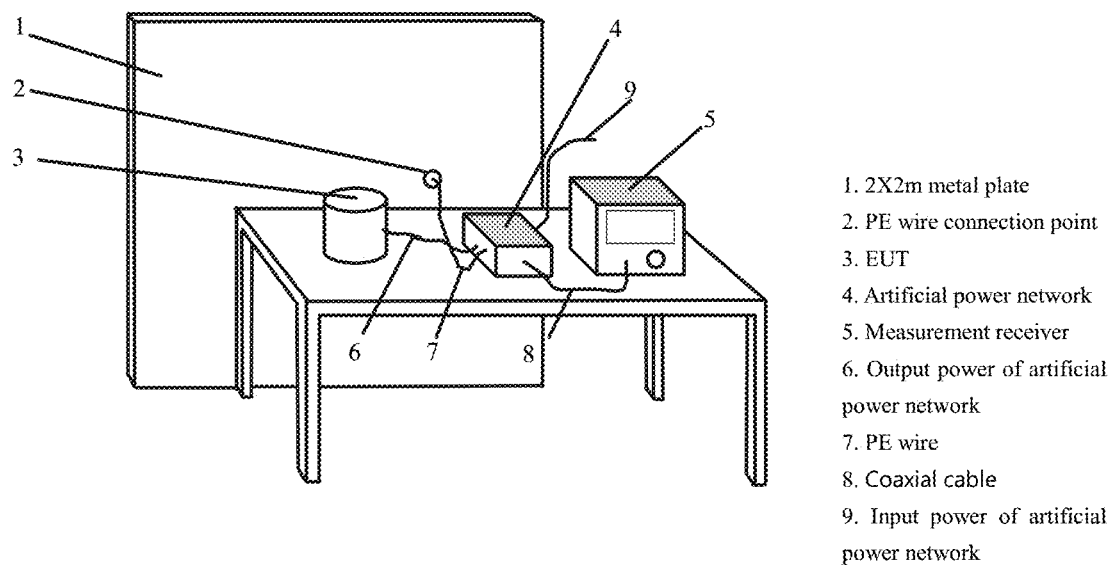
Figure 10:
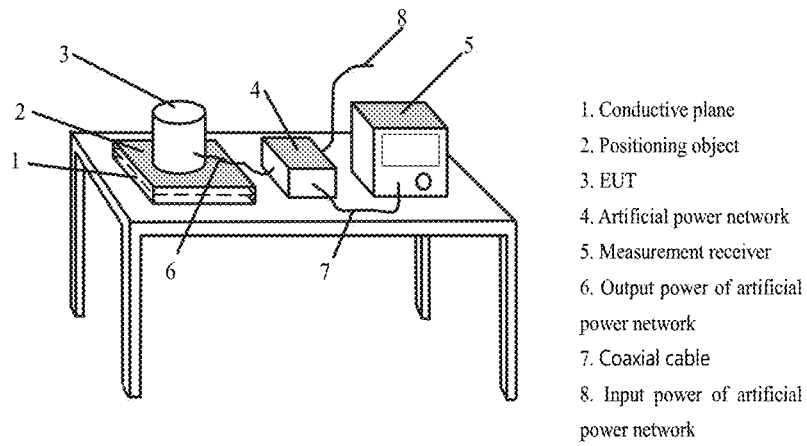

The method for setting the conductive plane disclosed in FIG. 2 or FIG. 3 can not only be applied to the EMI test of the equipment or device under test carried out in accordance with the standard test method and device as shown in FIG. 7 and FIG. 9, but also can be applied to, as illustrated by FIG. 8 and FIG. 10, the EMI test of the equipment or device under test performed by the method and device disclosed in this application.

EMBODIMENTS OF THE PRESENT INVENTION

The following embodiments described with reference to FIGS. 4 to 13 further illustrate the working principle of the method and device disclosed in the present application.

Figure 4:
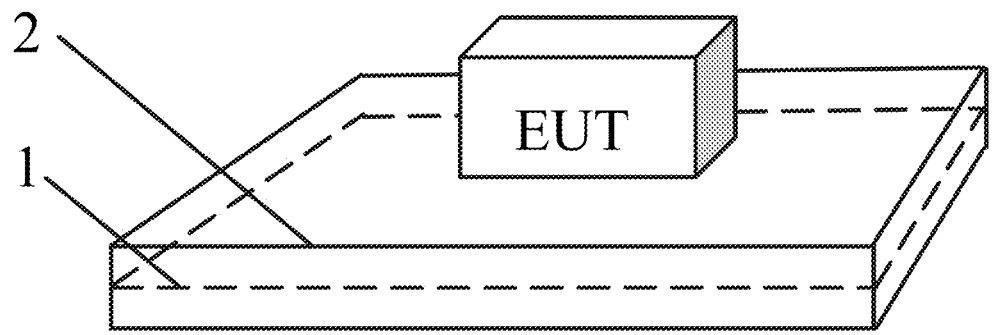

In embodiment 1, as shown in FIG. 4, the conductive plane 1 is composed of a copper-clad printed circuit board, which is fixed inside a plastic box, and the top of the plastic box serves as the positioning object 2, thus forming a basic conductive plane device. The distance from the EUT to the copper-clad printed circuit board is equal to the thickness of the top of the plastic box plus the space distance between the copper-clad printed circuit board and the top of the plastic box. As long as the EUT is placed in the same position of the device during each test, in this embodiment, it is placed on the top of the device as shown in FIG. 4, even if the test is repeated after a period of time, or the test is repeated in a different location, the distance from EUT to conductive plane always remains the same, which ensures the consistency of the test. It should be pointed out that in this embodiment, the rectangular parallelepiped is used to represent the plastic box and the EUT, which does not mean that they are rectangular parallelepiped. In practical applications, there are no restrictions and requirements on their shapes and sizes. In this embodiment, the conductive plane 1 is not grounded.

Figure 5:
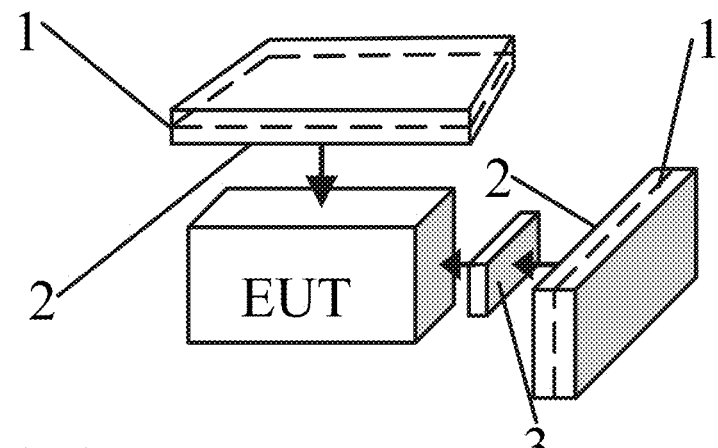

In embodiment 2, as shown in FIG. 5, the description of the conductive plane and positioning objects is the same as that of embodiment 1. The difference is that the plastic box fixed with the copper-clad printed circuit board is not placed at the bottom of the EUT, instead, it approaches EUT horizontally or from top to bottom, as shown by the arrow, touches EUT and is placed on the side or top of the EUT, which is especially convenient when the EUT is a heavy or huge device. Similarly, the distance from the EUT to the copper-clad printed circuit board is equal to the thickness of the top of the plastic box plus the spatial distance between the copper-clad printed circuit board and the top of the plastic box. This embodiment also demonstrates a case where the device contacts the EUT through an object 3 with a measurable thickness. In this case, the distance from the EUT to the copper-clad printed circuit board is equal to the thickness of the top of the plastic box plus the copper-clad printed circuit board to the top of the plastic box, plus the thickness of the object 3 whose thickness can be measured. It should be pointed out that in this embodiment, a rectangular parallelepiped is used to represent the plastic box, which can measure the thickness of the object and the EUT, but it does not mean that their shape is limited to the rectangular parallelepiped, and there are no restrictions and requirements on their shape in practical applications. In this embodiment, the conductive plane 1 is not grounded.

Figure 6:
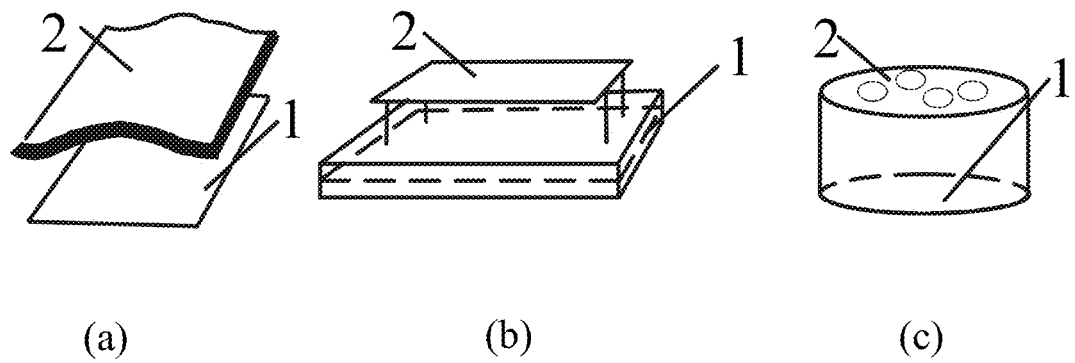

In embodiment 3, as shown in FIG. 6, includes (a) (b) (c) three different device configurations. In the configuration (a), the positioning object 2 is an irregularly curved object. Since its position relative to the conductive plane 1 is fixed, the vertical distance of each part of the positioning object 2 to the conductive plane 1 is known, and when a certain part of the surface of the object 2 touches the EUT, the vertical distance from the contact point to the conductive plane 1 can be immediately obtained. In the configuration (b), the positioning object 2 is a flat plate, which is connected to the box containing the conductive plane 1 through 4 telescopic connecting rods, and the positioning principle of the conductive plane 1 relative to the EUT is the same as (a), the difference is that the distance between the positioning object 2 and the conductive plane 1 can be adjusted by adjusting the length of the rod. In the configuration (c), the positioning object 2 and the conductive plane are both circular, and the surface of the positioning object 2 has several holes, and the positioning principle of the conductive plane 1 relative to the EUT is the same as (a). In this embodiment, the conductive plane 1 is not grounded.

In embodiment 4, as shown in FIG. 7, the test site and test equipment are set up in the production workshop of the product or equipment in accordance with the requirements of the test standard. 2×2 m metal plate 1 is placed upright on the test table, keeping a distance of 40 CM from EUT 3, 220V AC power 9 is connected to artificial power network 4, the output line of artificial power network 6 is connected to EUT to provide EUT working power, and the coaxial cable 8 of the measurement receiver 5 is connected with the artificial power network 4 to measure the EMI generated by the EUT on the output line 6 of the artificial power network (that is, the power line of the EUT). Different from the conventional standard test, the PE wire 7 from the power input power source 9 replaces the grounding wire, and connects with the metal plate 1 on the PE wire connection point 2 on the metal plate 1. Such a technical solution enables EMI testing of products or equipment even in production or application sites that lack a good grounding environment. Our test results show that the test result in this embodiment is the same as the test result of the metal plate 1 being grounded.

In embodiment 5, as shown in FIG. 8, the test setup is basically the same as that of embodiment 4, except that the conductive plane device shown in FIG. 4 replaces the 2×2 meter metal plate 1 in FIG. 7, and the conductive plane 1 is connected with PE wire 7. Obviously, the area of the conductive plane 1 and the distance from the EUT in this embodiment are different from those in the embodiment 4. Since the bottom of the EUT and the conductive plane 1 constitute the two poles of a capacitor, the area of the bottom of the EUT in the embodiment 4 and this embodiment, is smaller than that of the conductive plane 1, so that the parallel area of the capacitor electrode is equal to the area of the bottom of the EUT. The difference in the area of the conductive plane 1 does not affect the capacitance, only the distance difference will cause the difference in the capacitance. Therefore, by calculating the ratio of the distance from the conductive plane 1 to the EUT in Embodiment 4 and this embodiment, and correspondingly correcting the amplitude of the measured frequency spectrum in this embodiment, a result consistent with Embodiment 4 is obtained.

Figure 11:
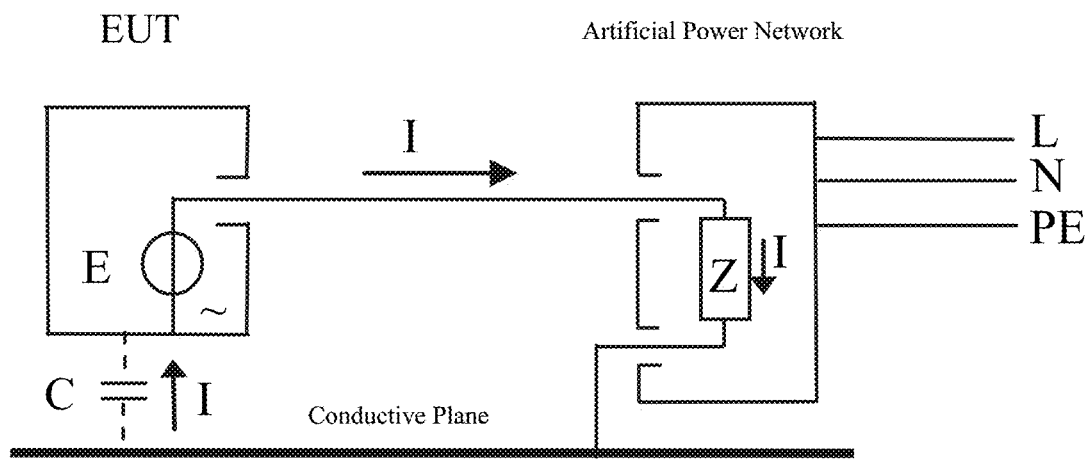

In Embodiment 6, the test layout of this embodiment is basically the same as in Embodiment 4 and Embodiment 5. The difference is that the conductive plane 1 is neither grounded nor connected to the PE wire, as shown in FIG. 9 and FIG. 10. The principle diagram of the EMI measurement is shown in FIG. 11. Because the EMI source E of the EUT generates an EMI current I, the current I flows through the input impedance Z of the artificial power supply network, flows through the metal plate as a conductive plane, and then flows through the stray capacitance C formed by the metal plate and the EUT and returns E; thus, the EMI spectrum of the EUT can be obtained by measuring the voltage between the two terminals of Z through an EMI receiver (such as the measurement receiver in FIGS. 9 and 10). Obviously, as shown in FIG. 11, whether the conductive plane is grounded or connected to a PE wire does not affect the test of the interference current I. In addition, during the implementation of this embodiment and many other embodiments, it is found that, compared with conductive plane grounding wire or PE wire, test with conductive plane being neither grounded nor connected to PE wire sometimes may obtain voltage waveform with phase differences; however, the assessment of EMI for equipment and products is based on interference spectrums that do not contain phase information, so the influence of phase differences on EMI measurements can be ignored. In other words, when the conductive plane is used for EMI measurement, it does not depend on grounding and PE. However, the conductive plane grounding or connecting to PE can provide safety protection against electric shock.

In some application scenarios, for example, in the field, not only is there no good grounding, but also no PE wire is available. The technical solution disclosed in this application demonstrated in this embodiment can realize on-site testing of equipment or devices, having advantage that other technologies do not have.

Figure 12:
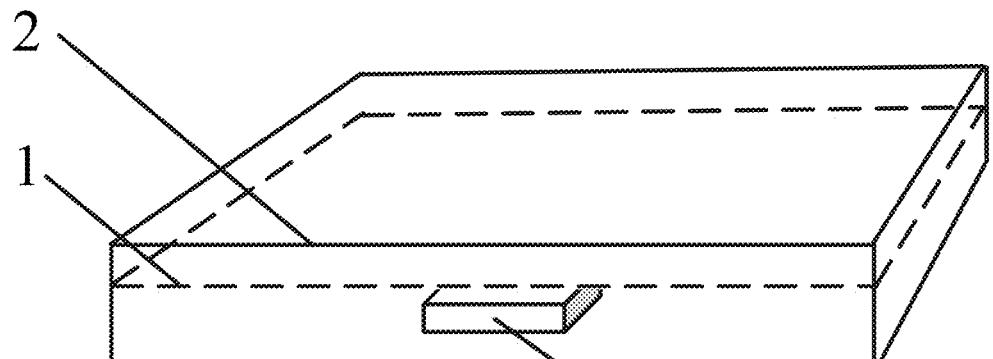

In embodiment 7, a power filter is embedded in the space under the conductive plane 1 shown in FIG. 12 to form a portable EMI test device.

Figure 13:
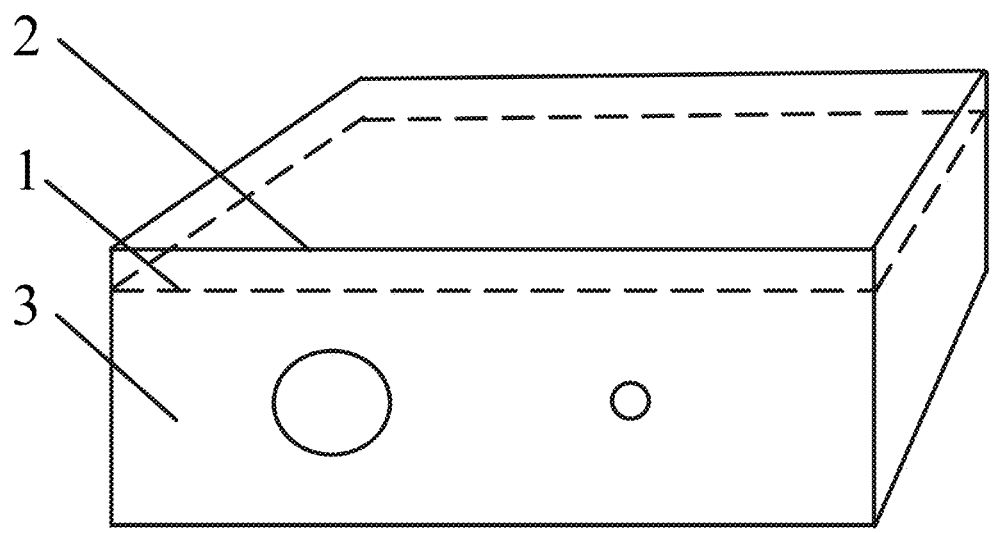

In embodiment 8, a conductive plane 1 is embedded on the top of the artificial power supply network 3 as shown in FIG. 13, and the top of the shell of the artificial power supply network 3 constitutes a positioning object 2.

The existing EMI measurement standards for equipment or devices stipulate the distance from the conductive plane to the EUT and the size of the conductive plane. The above-mentioned method and device disclosed in this application can be used at measurement at a distance and size different from the standard requirements, and the result can be directly used for the evaluation of the electromagnetic compatibility status of the equipment or device; or to be used to calculate the test result under the standard setting by the following steps: Calculate the capacitance of the conductive plane to the EUT formed by the actual distance and size, and compare it with the capacitance formed by the distance and size specified in the standard to convert the result of the test according to the standard; or measure the EMI of the EUT according to the standard settings, then measure the EMI of the EUT according to the method or device disclosed in this application, compare the two spectrums to obtain the peak amplitude deviation of the spectrum to form a deviation curve, and correct with the deviation curve the spectrum peak amplitude of other EUTs that are being measured according to the method or device disclosed in this application. Since what we are concerned about in practical applications is the peak of the interference spectrum, there is no need to modify the amplitude of the valleys of the spectrum.

The device disclosed in this application, as a basic test equipment unit for EMI testing, can be integrated with other components or equipment required for EMI testing, such as artificial power supply networks, power filters, EMI receivers, etc., to form a new equipment with conductive plane.

There are many ways to combine a conductive plane with EMI test components or instruments, for example, install the power filter below the conductive plane (assuming the positioning object is located above the conductive plane), or between the conductive plane and the positioning object, embed the conductive plane device in the artificial power network or place the conductive plane device around or on top of the EMI receiver, etc., that does not affect the use of the conductive plane device, but also reduce the size of the instrument or reduce the cost of the instrument, make the instrument more portable and easy to use.

INDUSTRIAL APPLICABILITY

This application discloses several positioning and setting methods of conductive planes used to measure EMI of equipment or devices, which can conveniently and accurately deploy the conductive planes at a predetermined distance on the bottom, all around or even the top of the EUT, ensuring the consistency of the EMI test of the EUT; the method disclosed in this application does not limit the shape and size of the conductive plane and the positioning object, which is beneficial to integrate the two into a portable device to test the EMI of the equipment or devices on different fields. The method disclosed in this application dispenses with the prior art's requirement for a good grounding of the conductive plane, enabling EMI testing of equipment and devices to be performed in locations that do not have a well grounded environment (regardless of whether the device disclosed in this application is used). The method and device for positioning and setting the conductive plane disclosed in this application can approach the EUT and deploy the conductive plane from horizontal or up and down directions, and can adjust the distance from the conductive plane to the EUT by adjusting the height of the device (as shown in FIG. 6(*b*)) to meet various testing requirements;

the device disclosed in this application is portable and does not need to be grounded or even connected to a PE wire, enabling it to be used in common production sites or even in the field, reducing test costs and test time compared to other laboratory test technology solutions.

The foregoing descriptions are only part of the embodiments of the present invention, not all of them. Based on the embodiments disclosed in this application, all other embodiments obtained by a person of ordinary skill in the art without creative work shall fall within the protection scope of the present invention.

The invention claimed is:

1. A method of setting a conductive plane, the method comprises: integrating the conductive plane for electromagnetic interference measurement with a box; said integration comprising fixing the conductive plane to the surface of the box and fixing the conductive plane to the interior of the box; said box as a container has interior space and is freely movable without tied/fixed to any object.

2. The method according to claim 1, when testing electromagnetic interference, placing the box which the conductive plane is fixed on, in the vicinity of an object to be tested; said vicinity includes the front, rear, left, right, above and below the object to be tested.

3. The method according to claim 1, wherein the box is a device or equipment for electromagnetic interference measurement.

4. The method according to claim 1, wherein the box is portable.

5. A conductive plane device, comprising:
   a conductive plane for electromagnetic interference measurement, a box, the conductive plane being integrated with the box; said integration comprises fixing the conductive plane to the surface of the box and fixing the conductive plane inside the box; said box as a container has interior space and is freely movable without tied/fixed to any object.

6. The device according to claim 5, wherein the conductive plane area is less than 2 m×2 m.

7. The device according to claim 5, wherein the box is portable.

8. The device according to claim 5, wherein the box is a device or equipment for electromagnetic interference measurement.

* * * * *